United States Patent [19]

Fujii

[11] Patent Number: 5,187,549
[45] Date of Patent: Feb. 16, 1993

[54] DYNAMIC RANDOM ACCESS MEMORY DEVICE INCLUDING STACKED CAPACITORS EACH HAVING A LOWER ELECTRODE ALIGNED WITH AN UPPER ELECTRODE WITHOUT TOLERANCE AND PROCESS OF FABRICATION THEREOF

[75] Inventor: Takeo Fujii, Tokyo, Japan

[73] Assignee: NEC Corporation, Tokyo, Japan

[21] Appl. No.: 651,065

[22] Filed: Feb. 5, 1991

[30] Foreign Application Priority Data

Feb. 5, 1990 [JP] Japan .................................. 2-25656

[51] Int. Cl.⁵ ...................... H01L 29/68; H01L 23/48
[52] U.S. Cl. .................................................. 257/306
[58] Field of Search ...................... 357/23.6, 51, 54, 71

[56] References Cited

U.S. PATENT DOCUMENTS 5,028,990  7/1991  Kotaki et al. ...................... 357/23.6

Primary Examiner—Mark V. Prenty
Attorney, Agent, or Firm—Sughrue, Mion, Zinn, Macpeak & Seas

[57] ABSTRACT

For decreasing the amount of real estate assigned to each memory cell, a random access memory device is fabricated on a semiconductor substrate from a plurality of memory cells each comprising a switching transistor and a storage capacitor, wherein the storage capacitor comprises a lower electrode provided over one of the source and drain regions of the switching transistor and held in contact therewith, a dielectric film structure covering the lower electrode, and an upper electrode held in contact with the dielectric film structure and having at least one side edge substantially self-aligned with one side edge of the lower electrode without any tolerance.

1 Claim, 11 Drawing Sheets

DYNAMIC RANDOM ACCESS MEMORY DEVICE INCLUDING STACKED CAPACITORS EACH HAVING A LOWER ELECTRODE ALIGNED WITH AN UPPER ELECTRODE WITHOUT TOLERANCE AND PROCESS OF FABRICATION THEREOF

FIELD OF THE INVENTION

This invention relates to a dynamic random access memory device and, more particularly, to the structure of a stacked capacitor incorporated in each memory cell of the dynamic random access memory device.

DESCRIPTION OF THE RELATED ART

Various structures have been proposed for a dynamic random access memory cell of one-transistor one-capacitor type, and the transistor and the capacitor are called as "switching transistor" and "storage capacitor". The storage capacitor usually belongs to any one of three types, i.e. plane type, trench type and stacked type. The plane type capacitor has a MIS (Metal-Insulator-Semiconductor structure fabricated partially in a semiconductor substrate and partially on the semiconductor substrate, and the trench type capacitor is formed in a narrow groove vertically extending from the major surface of a semiconductor substrate. The stacked type capacitor is fabricated over a semiconductor substrate and implemented by a lower electrode faced through a dielectric film to an upper electrode. The lower electrode is usually called as "memory electrode", and a data bit is stored therein in the form of electric charges. The upper electrode is usually shared with a plurality of dynamic random access memory cells and called as "opposite electrode".

A typical example of the stacked type storage capacitor is disclosed in ISSCC 1987 Digest of Technical Papers pages 284 and 285, and FIGS. 1 and 2 show the structure of a dynamic random access memory cell with a stacked type storage capacitor. The dynamic random access memory cell is fabricated on a p-type silicon substrate 1, and heavily doped channel stoppers 2 are provided in the silicon substrate 1. A thick field oxide film 3 partially covers the major surface of the silicon substrate 1 and defines an active area in the major surface. In the active area are formed a plurality of heavily doped n-type impurity regions 4a, 4b and 5 which serve as drain regions and a common source region. Thin gate oxide films 6a and 6b are grown on channel regions between the common source region 5 and the drain regions 4a and 4b, and word lines 7a and 7b extend on the gate oxide films 6a and 6b as gate electrodes. The word lines 7a and 7b or the gate electrodes are covered with a first inter-level insulating layer 8, and contact holes 9a and 9b are formed in the first inter-level insulating layer 8. For better understanding, not only the contact holes 9a and 9b but also other contact holes referred to hereinbelow are marked with X enclosed therein.

Memory electrodes 10a and 10b of polysilicon are formed on the first inter-level insulating layer 8 and respectively project through the contact holes 9a and 9b so as to be held in contact with the drain regions 4a and 4b, respectively. Thin dielectric films 11a and 11b cover the entire surfaces of the memory electrodes 10a and 10b respectively, and an opposite electrode 12 of polysilicon is faced through the dielectric films 11a and 11b to the memory electrodes 10a and 10b and overlain by a second inter-level insulating layer 13. A constant voltage level, typically, a power voltage level is supplied to the opposite electrode 12.

A contact hole 14 is formed through the first and second inter-level insulating layers 8 and 13, and a bit line 15 on the second inter-level insulating layer 14. The bit line 15 passes through the contact hole 4 and is held in contact with the common source region 5. However, the bit line 5 is not shown in FIG. 1. The bit line 15 is formed of tungsten silicide and propagates a data bit fed thereto and therefrom.

The drain region 4a, the common source region 5, the thin gate oxide film 6a and the gate electrode 7a form in combination a switching transistor SW1, and the memory electrode 10a, the dielectric film 11a and the opposite electrode 12 provide a stacked type storage capacitor STR1. The switching transistor SW1 and the storage capacitor STR1 as a whole constitute a random access memory cell M1. Similarly, the drain region 4b, the common source region 5, the thin gate oxide film 6b and the gate electrode 7b form in combination a switching transistor SW2, and the memory electrode 10b, the dielectric film 11b and the opposite electrode 12 provide a stacked type storage capacitor STR2. The switching transistor SW2 and the storage capacitor STR2 as a whole constitute a random access memory cell M2.

In a prior art fabrication process, the memory electrodes 10a and 10b are formed from a polysilicon film deposited on the first inter-level insulating layer 8 with a mask layer. After formation of the dielectric films 11a and 11b, another polysilicon film is deposited over the entire surface of the structure, and the polysilicon film is patterned with another mask layer so as to form the opposite electrode 12. Thus, the memory electrodes 11a and 11b and the opposite electrode 12 are patterned by using different mask layers, and the mask layers are formed in a lithographic process with respective photo-masks. In general, the photo-masks are not perfectly aligned with each other in the lithographic process, a tolerance TL is usually provided to the opposite electrode 12, and, for this reason, the edge of the opposite electrode 12 inwardly projects from the edges of the memory electrodes 10a and 10b. The tolerance TL usually ranges from 0.3 micron to 0.4 micron.

A problem is encountered in the prior art random access memory device in that the tolerance TL consumes non-ignorable percentage of real estate assigned to each random access memory cell. Namely, the real estate assigned to each memory cell is of the order of 4 to 5 square-microns, and each memory electrode 10a or 10b consumes an area of 1.0 micron by 1.5 micron. Since the length of 1.5 micron contains the tolerance TL, the tolerance TL wastes non-ignorable percentage of the area of 1.0 micron by 1.5 micron. In other words, the amount of electric charges accumulated in each memory electrode 10a or 10b or the capacitance of the storage capacitor STR1 or STR2 is relatively small for the real estate assigned to the memory electrode 10a or 10b, and, for this reason, a data bit memorized therein is not reliable. If the real estate assigned to each memory cell is further decreased for a larger integration density, the problem becomes more serious than now.

SUMMARY OF THE INVENTION

It is therefore an important object of the present invention to provide a random access memory device which has a stacked type storage capacitor formed without any tolerance.

It is also an important object of the present invention to provide a process of fabricating a dynamic random access memory device through which lower and upper electrodes are aligned with each other without any tolerance To accomplish these objects, the present invention proposes to provide an upper electrode aligned with a lower electrode. The upper electrode aligned with the lower electrode is formed through an etching stage for sequentially patterning the upper electrode, a dielectric film structure and a lower electrode using a single mask layer.

In accordance with one aspect of the present invention, there is provided a random access memory device fabricated on a single semiconductor substrate and having a plurality of memory cells, each memory cell comprising a) a switching transistor having impurity regions formed in the semiconductor substrate at spacing, a gate insulating film formed on that area between the impurity regions, and a gate electrode formed on the gate insulating film, and b) a storage capacitor having a lower electrode provided over one of the impurity regions and held in contact with the aforesaid one of the impurity regions, a dielectric film structure covering the lower electrode, and an upper electrode held in contact with the dielectric film structure and having at least one side edge substantially aligned with one side edge of the lower electrode.

In accordance with another aspect of the present invention, there is provided a process of fabricating a random access memory device on a semiconductor substrate, comprising the steps of: a) forming a gate insulating film on the semiconductor substrate; b) forming a gate electrode on the gate insulating film; c) doping the semiconductor substrate with impurity atoms so that impurity regions are formed on both sides of that area under the gate electrode; d) forming an inter-level insulating film for covering the impurity regions and the gate electrode; e) forming a contact hole in the inter-level insulating film for exposing a part of the aforesaid one of the impurity regions; f) depositing a first conductive film on the inter-level insulating film and allowing the first conductive film to be held in contact with the aforesaid one of the impurity regions through the contact hole; g) partially patterning the first conductive film; h) covering the first conductive film with a dielectric film structure; i) depositing a second conductive film on the dielectric film structure; j) forming a mask layer on the second conductive film so as to define a shape of an upper electrode; and k) sequentially patterning the second conductive film, the dielectric film structure and the first conductive film with the mask layer so that at least one side edge of the upper electrode is substantially aligned with one side edge of the lower electrode.

BRIEF DESCRIPTION OF THE DRAWINGS

The features and advantages of a dynamic random access memory device and a process of fabrication thereof according to the present invention will be more clearly understood from the following description taken in conjunction with the accompanying drawings in which.

DESCRIPTION OF THE PREFERRED EMBODIMENTS

First Embodiment

Figure 1:
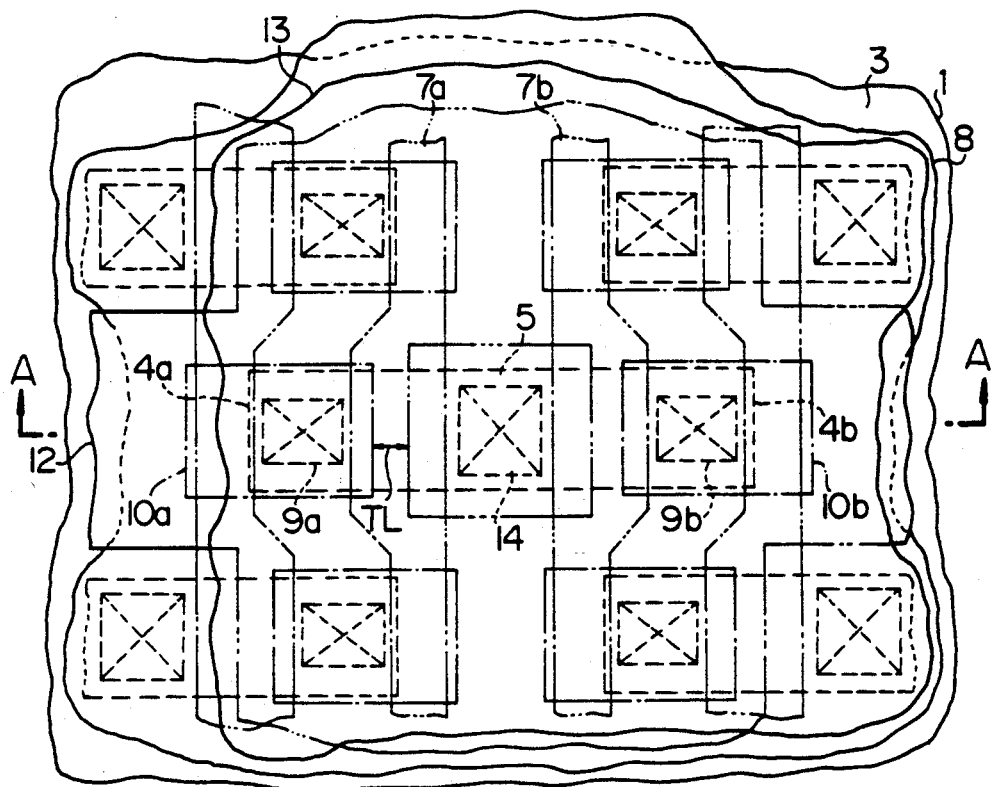
FIG. 1 is a plan view showing the layout of a prior art dynamic random access memory cell.
Figure 2:
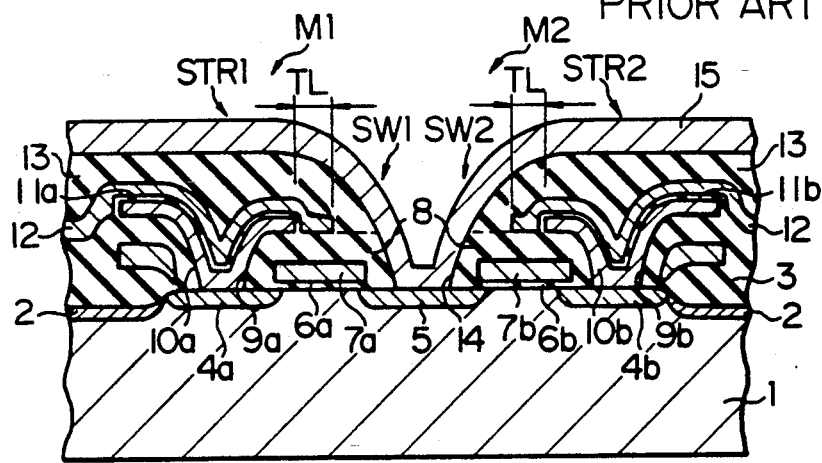
FIG. 2 is a cross sectional view taken along line A—A of FIG. 1 and showing the structure of the prior art random access memory cell.
Figure 3:
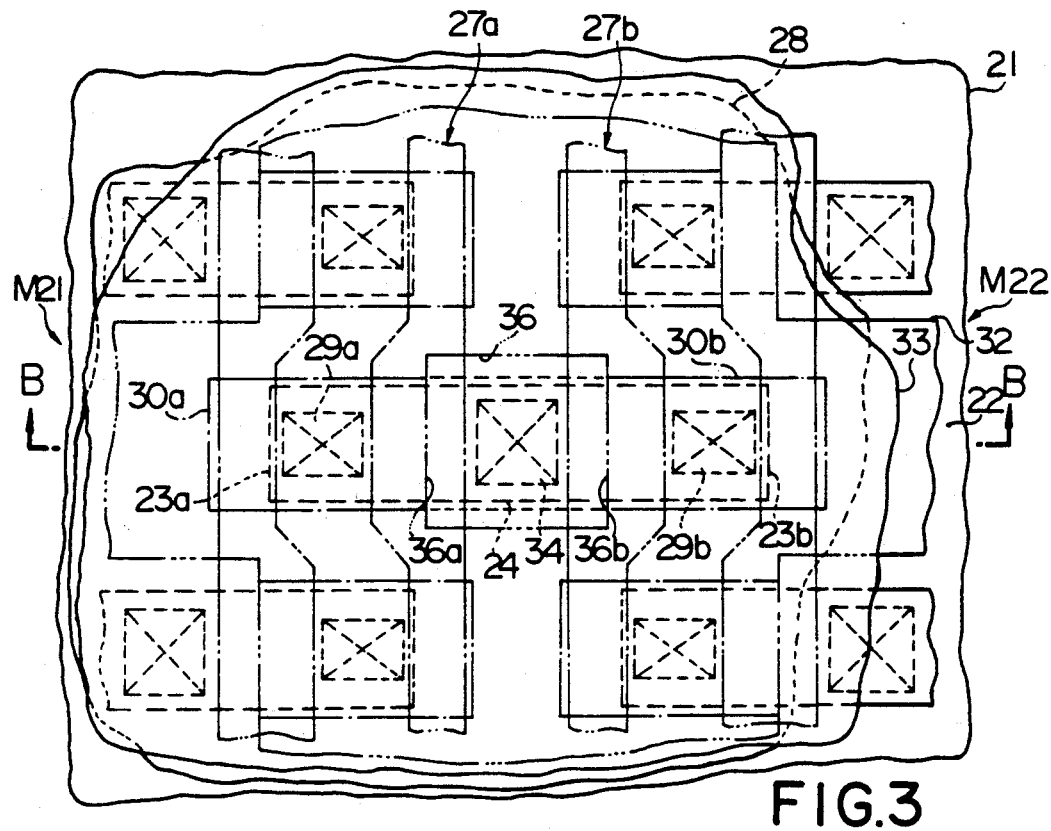
FIG. 3 is a plan view showing the layout of a random access memory device according to the present invention.
Figure 4:
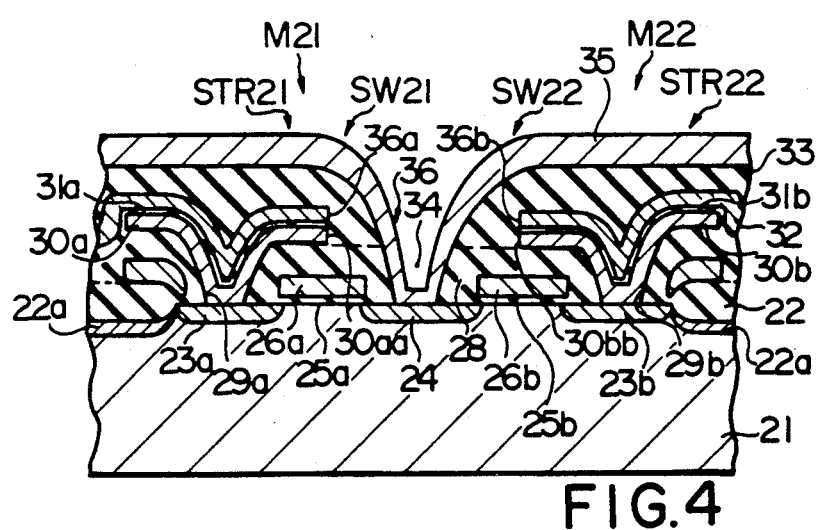
FIG. 4 is a cross sectional view taken along line B-B of FIG. 3 and showing the structure of the random access memory device.

Referring to FIGS. 3 and 4 of the drawings, a random access memory device embodying the present invention is fabricated on a lightly doped p-type silicon substrate 21, and a thick field oxide film 22 is grown on the major surface of the silicon substrate 21. Under the thick field oxide film 22 is formed heavily doped p-type channel stopper regions 22a which extend along the peripheries of the active areas, respectively. The thick field oxide film defines active areas in the major surface of the silicon substrate 21, and two memory cells M21 and M22 are fabricated in one of the active areas. The memory cells M21 and M22 are of the one-transistor one-capacitor type, and, accordingly, each memory cell M21 or M22 is fabricated from a switching transistor SW21 or SW22 and a stacked type storage capacitor STR21 or STR22.

In the active area are formed heavily doped n-type impurity regions 23a, 23b and 24 which are spaced from one another by channel regions. On the channel regions, thin gate oxide films 25a and 25b are respectively grown, and gate electrodes 26a and 26b are formed on the thin gate oxide films 25a and 25b, respectively. The gate oxide films 26a and 26b form parts of word lines 27a and 27b.

A first inter-level insulating film 28 covers the word lines 27a and 27b, and contact holes 29a and 29b are formed in the first inter-level insulating film 28. The contact holes 29a and 29b reach the heavily doped n-type impurity regions 23a and 23b, respectively, and the contact holes are marked with X so that any person will easily discriminate the contact holes from other components. On the first inter-level insulating film 28 are formed lower electrodes 30a and 30b which serve as memory electrodes of the storage capacitors STR21 and STR22. The lower electrodes 30a and 30b project through the contact holes 29a and 29b, respectively, and dielectric film structures 31a and 31b cover the lower electrodes 30a and 30b, respectively. In this instance, each of the dielectric film structure is implemented by a thin silicon oxide film, however, a thin silicon nitride film sandwiched between silicon oxide films may be used in another implementation. An upper electrode 32 is held in contact with the dielectric film structures 31a and 31b and opposite to the lower electrodes 30a and 30b. The upper electrode 32, or the opposite electrode, is shared between a plurality of memory cells including the memory cells M21 and M22. The upper electrode 32 is covered with a second inter-level insulating film 33, and another contact hole 34 is formed in the first and second inter-level insulating films 28 and 33. A bit line 35 extends on the second inter-level insulating film 33, and the bit line 35 passes through the contact hole 34 so as to be brought into contact with the heavily doped n-type impurity region 24. The bit line 35 is not shown in FIG. 3 so as to make the figure simple.

As will be better seen from FIG. 3, the upper electrode 32 has a rectangular aperture 36 partially defined by two side edges 36a and 36b. Turning to FIG. 4, the side edges 36a and 36b are substantially aligned with side edges 30aa and 30bb of the lower electrodes 30a and 30b, respectively. This means that no tolerance is provided for the upper electrode 32 with respect to the lower electrodes 30a and 30b, and, for this reason, a relatively large amount of real estate is assigned to each storage capacitor. The larger real estate the storage capacitor is assigned, the more electric charges the capacitor accumulates. For this reason, a data bit memorized in each memory cell M21 or M22 is reliable rather than that stored in the prior art memory cell.

Figure 5A:
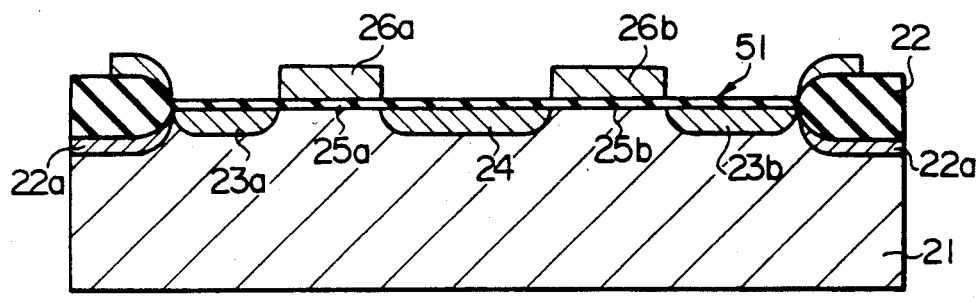
FIGS. 5A to 5G are cross sectional views showing the sequence of a process for fabricating the random access memory device shown in FIGS. 3 and 4.

Description is hereinbelow made on a process of fabricating the random access memory device shown in FIGS. 3 and 4 with reference to FIGS. 5A to 5G. The process sequence starts with the lightly doped p-type silicon substrate 21, and p-type impurity atoms are selectively introduced into the silicon substrate 21 through lithographic techniques. The silicon substrate 21 is thermally oxidized through a localized oxidation of silicon technique, and the heavily doped channel stopper regions 22a overlain by the field oxide film 22 is formed in the major surface of the silicon substrate 21. On a fresh surface of the silicon substrate 21 is thermally grown a thin silicon oxide film which provides the gate oxide films 25a and 25b. A polysilicon film is deposited on the entire surface of the structure by using a chemical vapor deposition technique, and is, then, patterned through lithographic techniques. The gate electrodes 26a and 26b are left on the gate oxide films 25a and 25b, and n-type impurity atoms are ion-implanted into the silicon substrate 21 using the gate electrodes 26a and 26b as a mask. As a result, the heavily doped n-type impurity regions 23a, 23b and 24 are formed in the silicon substrate 21, and the resultant structure of this stage is shown in FIG. 5A.

Figure 5B:
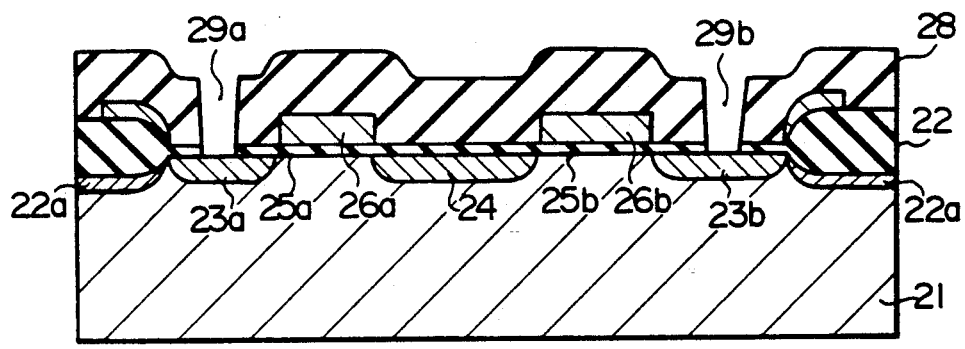

Silicon oxide is, then, deposited on the entire surface of the structure by using a chemical vapor deposition technique, and the silicon oxide thus deposited provides the first inter-level insulating film 28. An appropriate photoresist mask is formed on the silicon oxide film, and the silicon oxide film is partially etched away so that the contact holes 29a and 29b are formed in the first inter-level insulating film 28 as shown in FIG. 5B.

Subsequently, a polysilicon film 52 is deposited on the entire surface of the structure by using a chemical vapor deposition technique, and a photoresist solution is, then, spun onto the polysilicon film 52. The photoresist film is baked and patterned so that a photoresist mask 53 is formed on the polysilicon film 52 as shown in FIG. 5C.

Figure 5E:
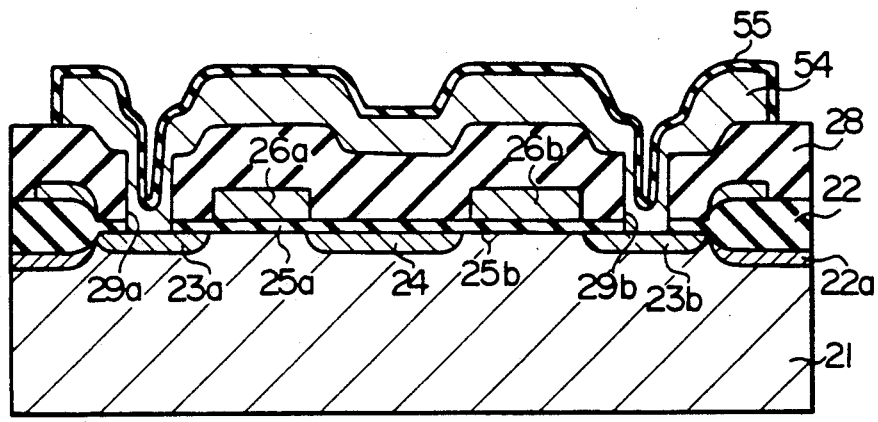
Figure 5F:
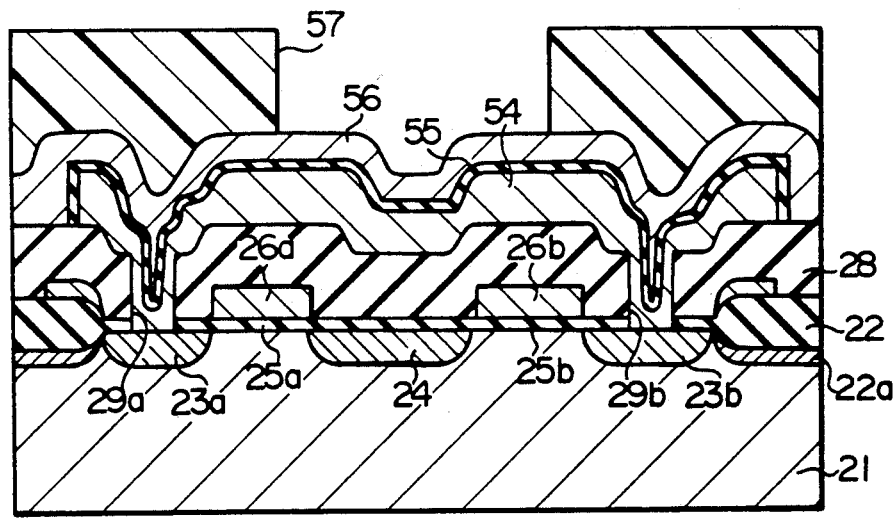
Figure 5C:
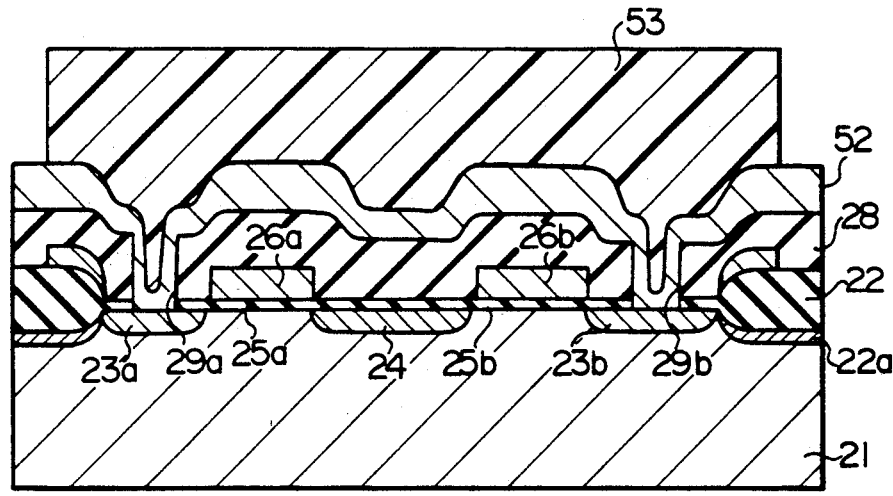
Figure 5D:
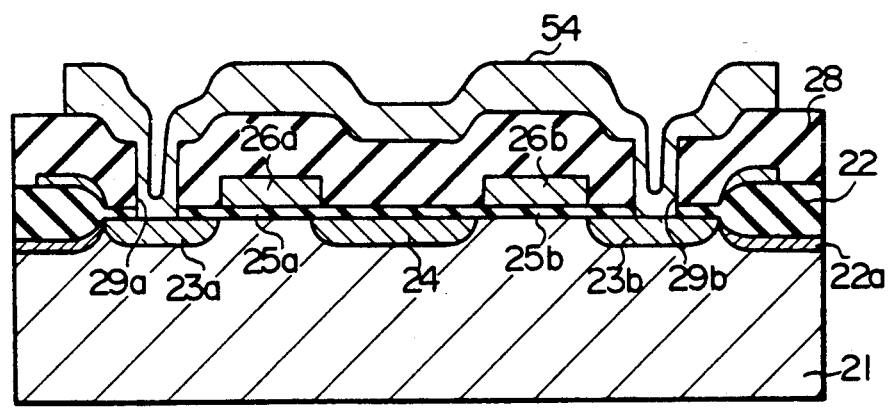
Figure 6:
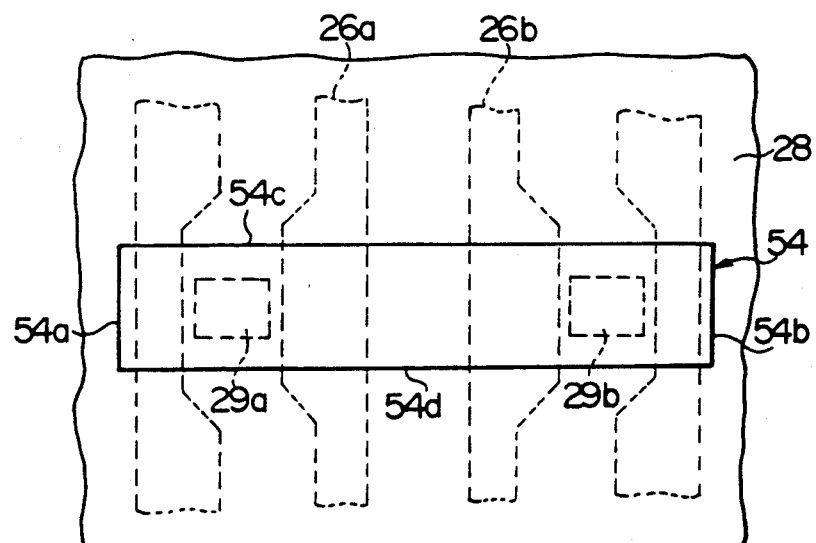
FIG. 6 is a plan view showing the layout of an intermediate structure shown in FIG. 5D.

Using the photoresist mask 53, the polysilicon film 52 is selectively removed so that a polysilicon strip 54 is left on the first inter-level insulating film 28 as shown in FIG. 5D. The polysilicon strip 54 has a rectangular shape, and outer side edges 54a and 54b and longitudinal edges 54c and 54d defines the outer periphery of the polysilicon strip 54 as will be understood from FIG. 6. If the lower electrodes 30a and 30b is merged with each other, the resultant configuration is something like the polysilicon strip 54. This means that the side edges 30aa and 30bb do not take place in the polysilicon strip 54.

The polysilicon strip 54 is covered with silicon oxide 55 as shown in FIG. 5E, and the silicon oxide film 55 may be produced through oxidation of the polysilicon strip 54. However, if the dielectric film structure is constituted by a thin silicon nitride film sandwiched between thin silicon oxide films, chemical vapor deposition techniques may be used for formation of the dielectric film structure.

A polysilicon film 56 is deposited on the entire surface of the structure, and a photoresist solution is spun onto the polysilicon film 56. A photoresist mask 57 is made from the photoresist film and defines the upper electrode 32. The resultant structure of this stage is shown in FIG. 5F.

Figure 5G:
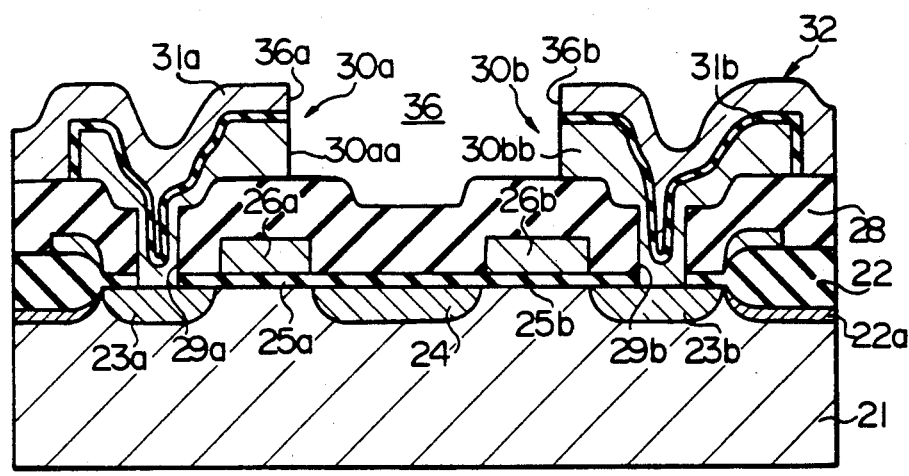

Using the photoresist mask 57, the polysilicon film 56, the silicon oxide film 55 and the polysilicon strip 54 are sequentially patterned by using anisotropical reactive ion etching technique, then the lower electrodes 30a and 30b, the dielectric film structures 31a and 31b and the upper electrode 32 are formed on the first inter-level insulating film 28. Since the photoresist mask 57 defines the upper electrode 32 as well as the lower electrodes 30a and 30b, the side edges 36a and 36b are substantially aligned with the side edges 30aa and 30bb as shown in FIG. 5G.

A silicon oxide film is then deposited on the entire surface of the structure so that the second inter-level insulating film 33 covers the upper and lower electrodes 32, 30a and 30b. The contact hole 34 is formed in the second inter-level insulating film 33, and a refractory metal silicide, typically tungsten silicide, is deposited on the second inter-level insulating film 33. The refractory metal silicide film is patterned through a lithographic process, and the bit line 35 is formed on the second inter-level insulating film 33 as shown in FIG. 4.

As will be understood from the foregoing description, the photoresist mask 57 allows the side edges 30aa and 30bb of the lower electrodes 30a and 30b to be substantially aligned with the side edges 36a and 36b of the upper electrode 32.

Second Embodiment

Figure 7:
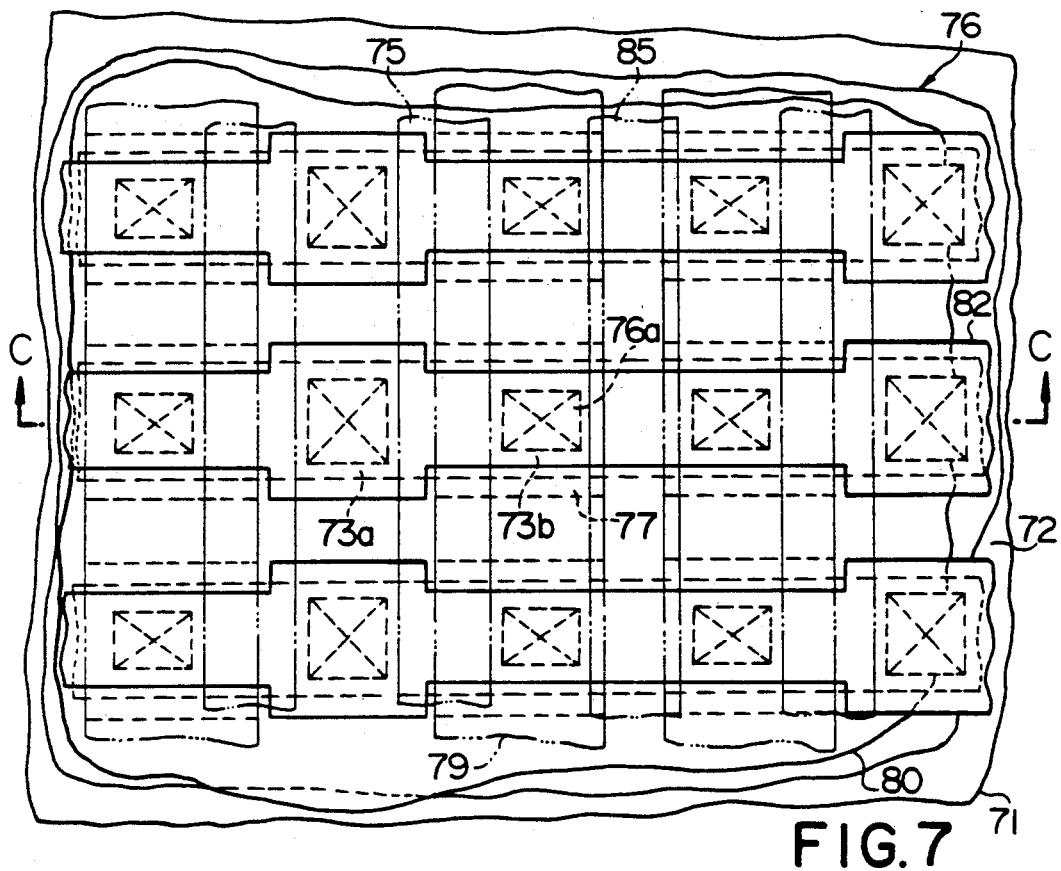
FIG. 7 is a plan view showing the layout of another random access memory device according to the present invention.
Figure 8:
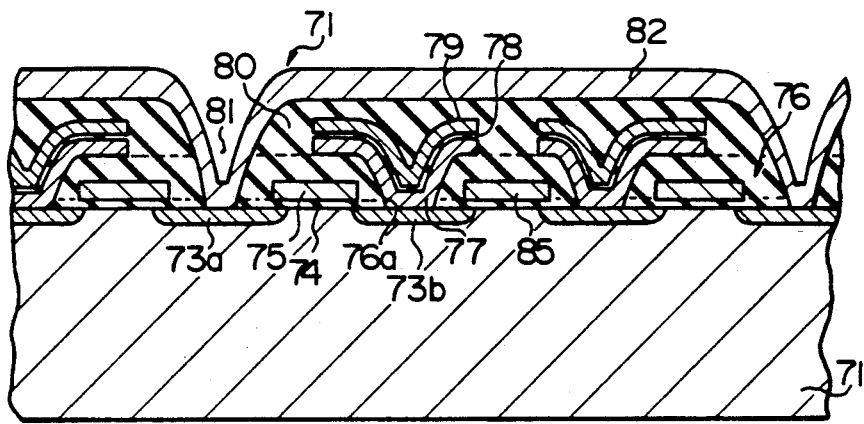
FIG. 8 is a cross sectional view taken along line C—C of FIG. 7 and showing the structure of the random access memory device.

Turning to FIGS. 7 and 8 of the drawings, another random access memory device embodying the present invention is illustrated and fabricated on a lightly doped silicon substrate 71. The random access memory device shown in FIGS. 7 and 8 is of the type disclosed in Japanese Patent Publication (Kokoku No. 62-26116 and Digest of Technical Papers 1989, pages 238 and 239, and is featured by storage word lines. Namely, active regions (which are indicated by broken lines) are defined by a thick field oxide film 72, and heavily doped p-type channel stopper regions (not shown) are provided under the thick field oxide film 72. The heavily doped n-type impurity regions 73a and 73b are formed in one of the active regions, and are spaced from each other by a channel region which is covered with a thin gate oxide film 74. A word line 75 extends on the thin gate oxide film 74 and serves as a gate electrode of a switching transistor SW71. A first inter-level insulating film 76 covers the word line 75, and a contact hole 76a is formed in the first inter-level insulating film 76. A lower electrode 77 (which is indicated by dotted line) passes through the contact hole 76a and is brought into contact with the heavily doped n-type impurity region 73b. A dielectric film structure 78 covers the lower electrode 77, and a storage word line 79 is opposite to the lower electrode 77. The storage word line 79 is shared between the lower electrodes arranged in parallel to the word line 74 as an upper electrode. A second inter-level insulating film 80 covers the storage word line 79, and a contact hole 81 is formed in the first and second inter-level insulating films 76 and 80. A bit line 82 of tungsten silicide extends on the second inter-level insulating film 80 and is brought into contact with the heavily doped n-type impurity region 73a. A gate electrode 85 is provided over that area between adjacent storage capacitors, and the gate electrode 85 is maintained in a low voltage level so as to provide electrical isolation therebetween. The area between the adjacent storage capacitors may be doped with p-type impurity atoms for better isolation.

Figure 9A:
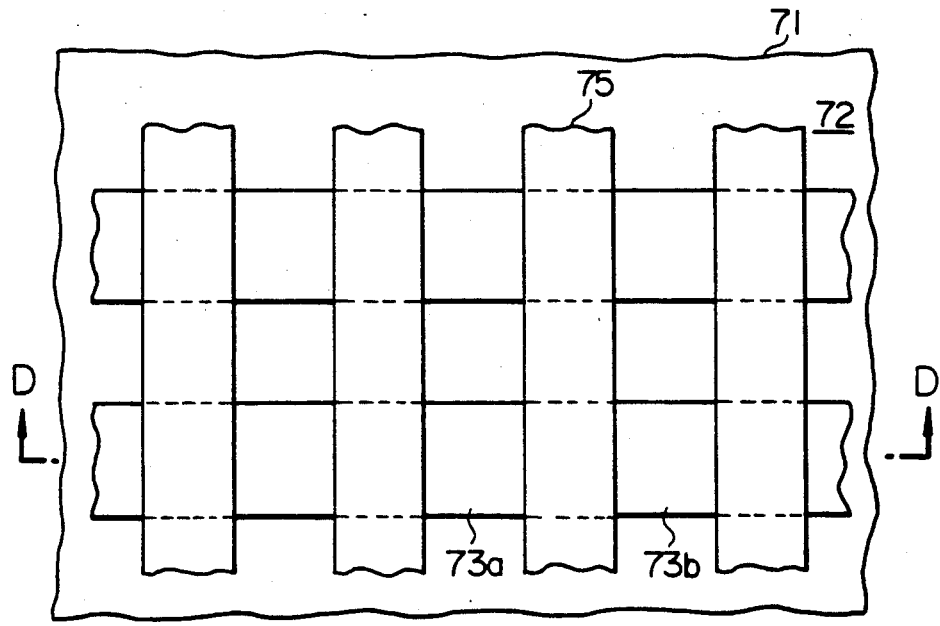
FIG. 9A to 9C are plan views showing the sequence of another process for fabricating the random access memory device shown in FIGS. 7 and 8.
Figure 9B:
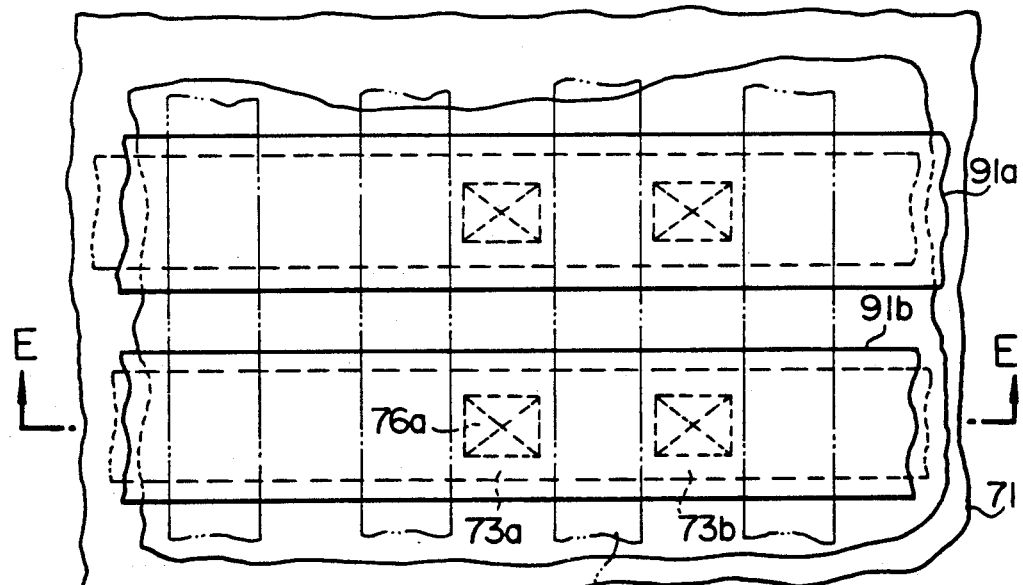
Figure 9C:
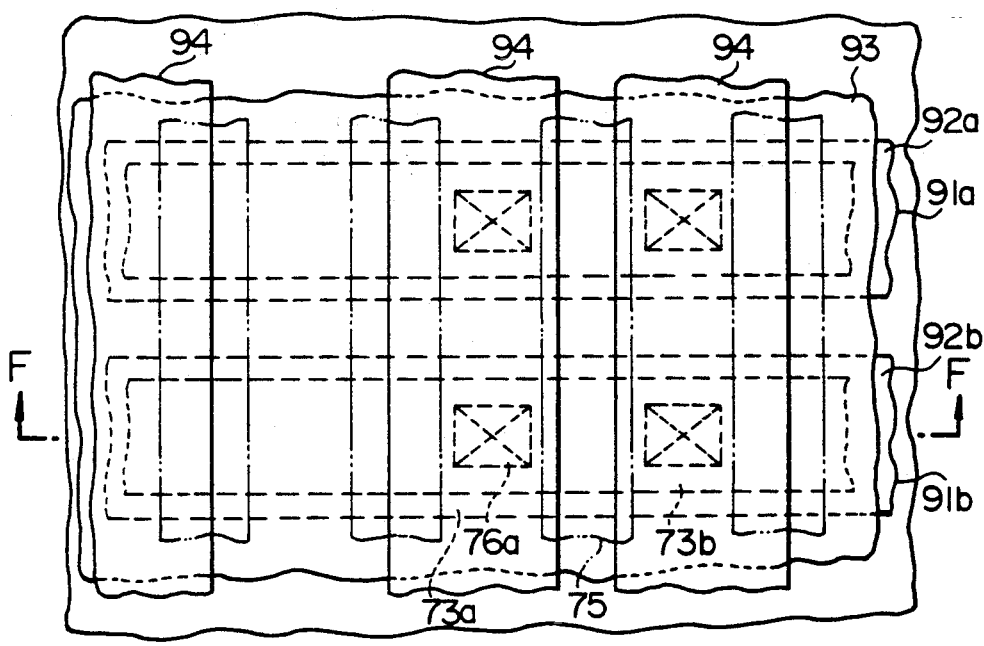
Figure 10A:
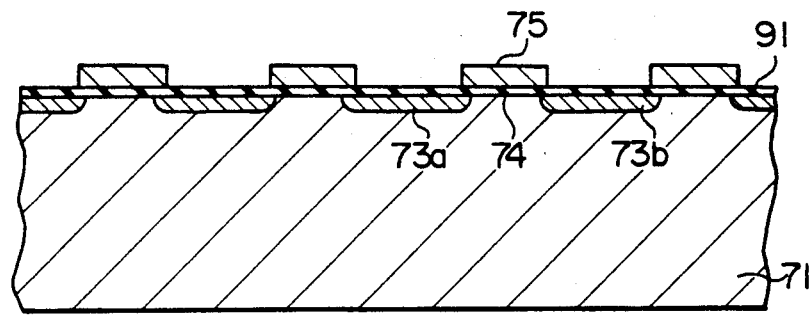
FIGS. 10A to 10C are cross sectional views taken along lines D—D to F—F and showing the intermediate structures of the random access memory device.

Description is made on a process of fabricating the random access memory device shown in FIGS. 7 and 8 with reference to FIGS. 9A to 9C and 10A to 10C. The process starts with the lightly doped p-type silicon substrate 71, heavily doped p-type channel stopper regions and the thick filed oxide film 72 are, then, formed on the silicon substrate as similar to the first embodiment. A thin silicon oxide film 91 is thermally grown on the active regions and partially provides the gate oxide film 74. A polysilicon film is deposited on the entire surface of the structure and is patterned through a lithographic process. Then, the word line 75, which partially provides the gate electrode, is formed on the field oxide film and the thin silicon oxide film 91. N-type impurity atoms are ion-implanted into the silicon substrate 71 using the word line as a mask, and the heavily doped n-type impurity regions 73a and 73b are formed in the silicon substrate 71. The layout and the structure at this stage are shown in FIGS. 9A and 10A, respectively.

Figure 10B:
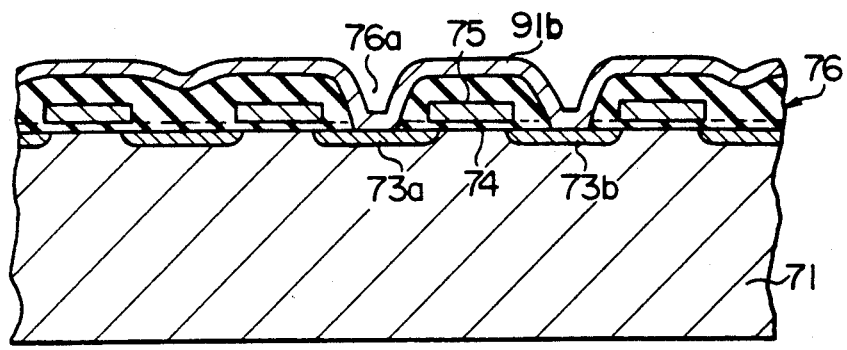
Figure 10C:
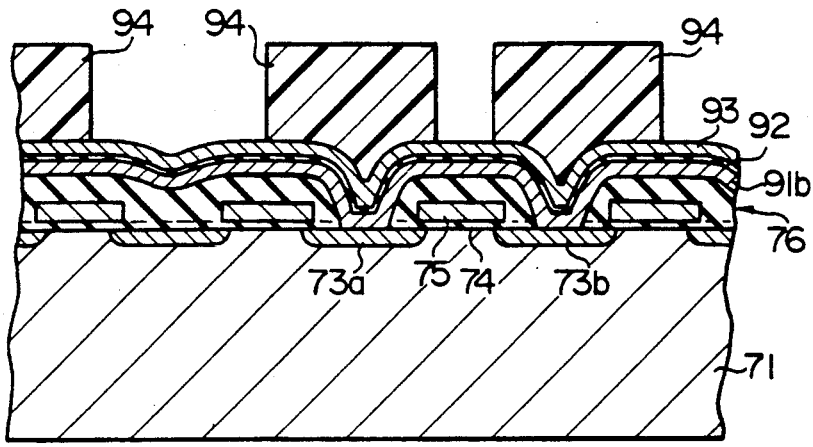

The first inter-level insulating film 76 is deposited on the entire surface of the structure, and the contact hole 76a is formed in the first inter-level insulating film 76. A polysilicon film is deposited on the entire surface of the structure and passes through the contact hole 76a to be brought into contact with the heavily doped n-type impurity region 73a. An appropriate photoresist mask is formed on the polysilicon film, and the polysilicon film is partially patterned with the photoresist mask. Namely, the photoresist mask on the polysilicon film only defines longitudinal ends, and the polysilicon film is shaped into a plurality of polysilicon strips 91a and 91b. The resultant structure at this stage is shown in FIGS. 9B and 10B. The polysilicon strips 91a and 91b are covered with dielectric film structures 92a and 92b, and each of the dielectric film structures 92a and 92b is implemented by a thin silicon oxide film and a thin silicon nitride film. A polysilicon film 93 is deposited on the entire surface of the structure, and a photoresist solution is spun onto the polysilicon film 93. The photoresist film is patterned into a photomask 94 through a lithographic process, and the photoresist mask 94 defines the storage word lines 79. The resultant structure at this stage is shown in FIGS. 9C and 10C.

The polysilicon film 93, the dielectric film structures 92a and 92b and the polysilicon strips 91a and 91b are sequentially etched by using anisotropical reactive ion etching technique. Then, the storage word lines 79 and the lower electrodes 77 are formed in facing relationship to each other as described with reference to FIGS. 7 and 8. A silicon oxide film is deposited on the entire surface of the structure as the second inter-level insulating film 80, and the contact hole 81 is formed in the first and second inter-level insulating films 76 and 80. A tungsten silicide film is deposited and patterned to form bit lines. As a result, the random access memory device shown in FIGS. 7 and 8 is accomplished.

The random access memory device thus fabricated has the storage capacitor with the lower electrode 77 substantially aligned with the storage word line 79, and, for this reason, the capacitance of the storage capacitor is increased without any occupation of additional real estate.

Third Embodiment

Figure 11:
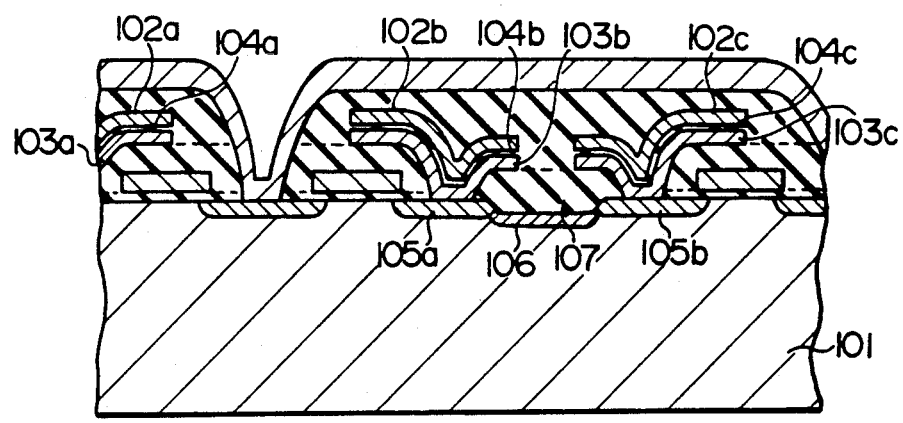
FIG. 11 is a cross sectional view showing the structure of still another random access memory device according to the present invention.

Turning to FIG. 11 of the drawings, still another random access memory device embodying the present invention is fabricated on a lightly doped p-type silicon substrate 101. The random access memory device shown in FIG. 11 is also of the type having storage word lines 102a, 102b and 102c faced to lower electrodes 103a, 103b and 103c through dielectric film structures 104a, 104b and 104c. The lower electrodes 103a to 103c are substantially aligned with the storage word lines 102a to 102c at the side edges thereof, and each storage capacitor occupies a relatively small amount of real estate.

The lower electrodes 103b and 103c are held in contact with heavily doped n-type regions 105a and 105b, and a heavily doped p-type channel stopper region 106 and a thick field oxide film 107 are provided between the heavily doped n-type impurity regions 105a and 105b for electrical isolation.

Although particular embodiments of the present invention have been shown and described, it will be obvious to those skilled in the art that various changes and modifications may be made without departing from the spirit and scope of the present invention.

What is claimed is:

1. A random access memory device fabricated on a single semiconductor substrate and having a plurality of memory cells, each memory cell comprising:

a) a switching transistor having impurity regions formed in said semiconductor substrate, a channel forming region formed in said semiconductor substrate between said impurity regions, a gate insulating film formed on that area between said impurity regions, and a gate electrode formed on said gate insulating film, and b) a storage capacitor having a lower electrode provided over one of said impurity regions and held in contact with said one of said impurity regions, a dielectric film structure covering said lower electrode, and an upper electrode held in contact with said dielectric film structure and having at least one side edge substantially aligned with one side edge of said lower electrode, said gate electrode is covered with a first inter-level insulating film having a contact hole, said contact hole allowing said lower electrode to be held in contact with said one of said impurity regions, said upper electrode being covered with a second interlevel insulating film, another contact hole passing through said first and second inter-level insulating films for allowing a bit line to be held in contact with the other of said impurity regions, said one side edge of said upper electrode being located over said first inter-level insulating film and faced to said another contact hole, said upper electrode being implemented by a storage word line having another side edge substantially aligned with another side edge of said lower electrode.

* * * * *